United States Patent
Renaud et al.

(10) Patent No.: US 10,312,368 B2
(45) Date of Patent: Jun. 4, 2019

(54) HIGH VOLTAGE SEMICONDUCTOR DEVICES AND METHODS FOR THEIR FABRICATION

(71) Applicant: NXP USA, Inc., Austin, TX (US)

(72) Inventors: Philippe Renaud, Chandler, AZ (US); Zihao M. Gao, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/465,407

(22) Filed: Mar. 21, 2017

(65) Prior Publication Data

US 2017/0194420 A1 Jul. 6, 2017

Related U.S. Application Data (62) Division of application No. 14/447,157, filed on Jul. 30, 2014, now abandoned.

(51) Int. Cl.
*H01L 29/78* (2006.01)
*H01L 29/10* (2006.01)
(Continued)

(52) U.S. Cl.
CPC ........ *H01L 29/7835* (2013.01); *H01L 21/266* (2013.01); *H01L 21/26513* (2013.01);
(Continued)

(58) Field of Classification Search
CPC . H01L 29/0847; H01L 21/22; H01L 29/7835; H01L 29/66659; H01L 29/66681;
(Continued)

(56) References Cited

U.S. PATENT DOCUMENTS 5,460,986 A 10/1995 Tam et al.
5,903,032 A 5/1999 Duvvury
(Continued)

FOREIGN PATENT DOCUMENTS

WO 2008020072 A1 2/2008

OTHER PUBLICATIONS

Kunsik Sung et al., "High-side N-channel LDMOS for a High Breakdown Voltage", Journal of the Korean Physical Society, May 2011, pp. 1411-1416, vol. 58, No. 5.
(Continued)

*Primary Examiner* — Jamie C Niesz (57) ABSTRACT

Semiconductor devices include a semiconductor substrate containing a source region and a drain region, a gate structure supported by the semiconductor substrate between the source region and the drain region, a composite drift region in the semiconductor substrate, the composite drift region extending laterally from the drain region to at least an edge of the gate structure, the composite drift region including dopant having a first conductivity type, wherein at least a portion of the dopant is buried beneath the drain region at a depth exceeding an ion implantation range, and a well region in the semiconductor substrate. The well region has a second conductivity type and is configured to form a channel therein under the gate structure during operation. Methods for the fabrication of semiconductor devices are described.

16 Claims, 7 Drawing Sheets

(51) Int. Cl.
*H01L 29/66* (2006.01)
*H01L 29/40* (2006.01)
*H01L 29/417* (2006.01)
*H01L 29/08* (2006.01)
*H01L 21/265* (2006.01)
*H01L 21/266* (2006.01)
*H01L 29/167* (2006.01)

(52) U.S. Cl.
CPC ........ *H01L 29/0847* (2013.01); *H01L 29/105* (2013.01); *H01L 29/1095* (2013.01); *H01L 29/167* (2013.01); *H01L 29/402* (2013.01); *H01L 29/4175* (2013.01); *H01L 29/66575* (2013.01); *H01L 29/66659* (2013.01); *H01L 29/1045* (2013.01); *H01L 29/1083* (2013.01)

(58) Field of Classification Search
CPC ........... H01L 21/02634; H01L 21/2033; H01L 21/2053
See application file for complete search history.

(56) References Cited

U.S. PATENT DOCUMENTS

| | | | |
|---|---|---|---|
| 8,704,307 B2* | 4/2014 | Kim | H01L 27/0266 257/355 |
| 2011/0227154 A1* | 9/2011 | Ono | H01L 29/0634 257/335 |
| 2013/0146973 A1* | 6/2013 | Mitra | H01L 29/7835 257/335 |
| 2015/0255596 A1* | 9/2015 | Cai | H01L 29/6659 257/337 |
| 2016/0056114 A1* | 2/2016 | Gao | H01L 23/60 257/340 |

OTHER PUBLICATIONS

Yin Shan et al., "Design of 700 V triple RESURF nLDMOS with low on-resistance", Journal of Semiconductors, Nov. 2011, pp. 114002-1 through 114002-4, vol. 32, No. 11.

* cited by examiner

HIGH VOLTAGE SEMICONDUCTOR DEVICES AND METHODS FOR THEIR FABRICATION

CROSS-REFERENCE TO RELATED APPLICATION

This application is a divisional application of U.S. application Ser. No. 14/447,157, entitled "High Voltage Semiconductor Devices and Methods for their Fabrication" and filed Jul. 30, 2014, the entire disclosure of which is hereby incorporated by reference.

TECHNICAL FIELD

The present teachings relate generally to semiconductor devices.

BACKGROUND

Integrated circuits (ICs) and other electronic devices often include arrangements of interconnected field-effect transistors (FETs), also called metal-oxide-semiconductor field-effect transistors (MOSFETs), or simply MOS transistors or devices. A typical MOS transistor includes a gate electrode as a control electrode and spaced-apart source and drain electrodes. A control voltage applied to the gate electrode controls the flow of current through a controllable conductive channel between the source and drain electrodes.

Power transistor devices are designed to be tolerant of the high currents and voltages that are present in some applications. Some power transistor devices are also designed to handle radio frequency (RF) signals, such as the devices used in wireless communications and other RF power amplifier applications. One type of RF power transistor device is a laterally diffused metal-oxide-semiconductor (LDMOS) transistor. In an LDMOS device, charge carriers drift through a drift space between a channel region and the drain electrode under the electric field arising from an operating voltage applied between the source and drain electrodes.

Future markets for RF transistors target higher operating frequencies as well as higher output power at moderated frequencies (e.g., megahertz (MHz) ranges). By way of example, RF transistors may be used in broadcast and laser applications. At present, high-power RF transistors are made primarily using wide-bandgap semiconductors (e.g., gallium nitride). Due to the costs associated with such materials, market-pricing requirements may not be satisfied.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION

Semiconductor devices (e.g., LDMOS transistor device) optimized for power RF applications and exhibiting a breakdown voltage (BV) above about 200 volts (V)—in some embodiments, up to about 300V—have been discovered and are described herein. As further described below, devices in accordance with the present teachings include a deep n-type high voltage (NHV) region buried under the drain contact and extending towards the gate. The NHV region is located primarily under the drain as opposed to the gate. Moreover, as further described below, devices in accordance with the present teachings may include a composite drift region that merges a deep n-type NHV region with a shallow NHV region, such that the buried NHV region is electrically coupled with the shallow NHV region and there is no n-p-n transition therebetween.

Devices in accordance with the present teachings may be optimized to maximize source-to-drain breakdown voltage (BVdss) while keeping the maximum drain current (Idmax), the on-state resistance (Ron), the drain-to-gate capacitance (Cdg) and the drain-to-source capacitance (Cds) as low as possible. As further described below, devices in accordance with the present teachings may be fabricated using multiple epitaxy steps, whereby a buried NHV region may be merged with a shallow NHV region during one or more subsequent anneal cycles in order to form a composite drift region.

Throughout this description and in the appended claims, the term "buried" as used in reference to a dopant and/or a doped region refers to the dopant or at least a portion of the doped region being present at a depth below a semiconductor substrate surface that is greater than a depth achievable via standard ion implantation. As used herein, the phrase "standard ion implantation" refers to conventional methods known in the industry as of the filing date of this patent application. In some embodiments, the term "buried" describes a depth greater than about 1 micron beneath a top surface of a semiconductor substrate. In some embodiments, the depth is greater than about 1.3 microns, in some embodiments greater than about 1.6 microns, in some embodiments greater than about 1.9 microns, in some embodiments greater than about 2.0 microns, in some embodiments greater than about 2.1 microns, in some embodiments greater than about 2.2 microns, in some embodiments greater than about 2.3 microns, in some embodiments greater than about 2.4 microns, in some embodiments greater than about 2.5 microns, in some embodiments greater than about 2.6 microns, in some embodiments greater than about 2.7 microns, in some embodiments greater than about 2.8 microns, in some embodiments greater than about 2.9 microns, and in some embodiments greater than about 3.0 microns.

By way of general introduction, a semiconductor device in accordance with the present teachings includes (a) a semiconductor substrate including a source region and a drain region; (b) a gate structure supported by the semiconductor substrate between the source region and the drain region; (c) a well region in the semiconductor substrate, wherein the well region is configured to form a channel therein under the gate structure during operation of the semiconductor device; and (d) a composite drift region in the semiconductor substrate. The composite drift region extends laterally from the drain region to at least an edge of the gate structure and includes dopant having a first conductivity type. The semiconductor substrate has the first conductivity type and the well region has a second conductivity type. At least a portion of the dopant in the composite drift region is buried beneath the drain region at a depth exceeding an ion implantation range.

Although described below in connection with n-channel LDMOS transistors, the disclosed devices are not limited to any particular transistor configuration. N-channel LDMOS devices are described and illustrated herein for convenience of description and without any intended limitation. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
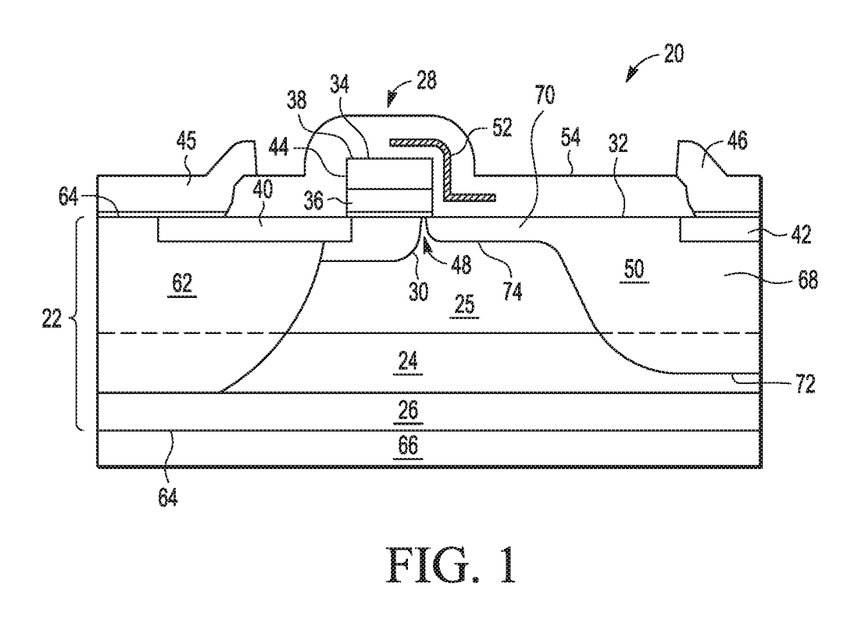
FIG. 1 shows a cross-sectional schematic view of an exemplary semiconductor device in accordance with the present teachings.

FIG. 1 is a schematic cross-sectional view of an example of an n-channel LDMOS device 20 constructed in accordance with one embodiment. The device 20 may be configured for operation as an RF LDMOS transistor device. The device 20 includes a semiconductor substrate 22, which may, in turn, include a plurality of epitaxial layers. For example, in the representative device 20 shown in FIG. 1, the semiconductor substrate 22 includes a first epitaxial layer 24 and a second epitaxial layer 25. In this example, the first epitaxial layer 24 includes a p-type epitaxial layer grown on an original substrate 26, and the second epitaxial layer 25 includes a p-type epitaxial layer grown on the first epitaxial layer 24. In accordance with the present teachings, after formation of the first epitaxial layer 24 on the original substrate 26, the first epitaxial layer 24 may optionally be masked and then implanted with dopant (e.g., an n-type dopant such as arsenic (As), phosphorus (P), or a combination thereof). The optional masking may be performed to concentrate the n-type dopant in a region that will align with the drain region and/or drain contact of the semiconductor device 20. After the first epitaxial layer 24 has been implanted, the second epitaxial layer 25 may be formed on top of the first epitaxial layer 24 and then implanted with dopant (e.g., an n-type dopant such as As, P, or a combination thereof). In some embodiments, an anneal step may be performed after implantation of the first epitaxial layer 24 before formation of the second epitaxial layer 25 in order to drive the implant diffusion within the first epitaxial layer 24. The implantation of the second epitaxial layer 25 may be performed with or without masking.

The original substrate 26 may be a heavily, moderately, or lightly doped p-type substrate in some embodiments, such as those having multiple epitaxial layers. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including only two epitaxially grown layers, and instead may be supported by a wide variety of other types of semiconductor substrates.

A device area 28 is depicted in FIG. 1. The device area 28 may include or correspond with one or more active areas of the device 20. In some embodiments, the device area 28 is defined by one or more doped isolating regions (not shown) in the semiconductor substrate 22 (e.g., the first epitaxial layer 24 and the second epitaxial layer 25). The doped isolating region(s) may surround the device area 28. These regions act as a barrier separating the device area 28 from other portions of the substrate 22 (or the original substrate 26). For example, the device area 28 may be further defined via a moderately or heavily doped n-type isolating well laterally surrounding the device area 28. The isolating well may be ring-shaped. The device area 28 may alternatively or additionally be defined by one or more isolation regions, such as a shallow trench isolation (STI) region, a deep trench isolation (DTI) region, or a field oxide region (fieldox).

The device 20 includes a well or diffused region 30 in the semiconductor substrate 22. During operation, a channel or channel region is formed in the well region 30 at a surface 32 of the semiconductor substrate 22. The channel is formed under a gate structure 34 of the device 20 via application of a bias voltage to a conductive portion (e.g., polysilicon layer) of the gate structure 34. The well region 30 may be a region formed by lateral diffusion under the gate structure 34. The well region 30 may be considered a body or base region of the device 20. In this example, the well region 30 is a p-type well formed in the second epitaxial layer 25 of the semiconductor substrate 22. The p-type well region 30 is more heavily doped than the second epitaxial layer 25 (e.g., a doping level of between about $10^{16}$ and about $3 \times 10^{17}$ as compared to a doping level of about $10^{16}$). The p-type well may be configured for high voltage operation or other operational conditions in typical RF applications. The well region 30 may be configured to establish a desired threshold voltage and/or other operational parameters of the device 20. For example, the dopant concentration level and the depth of the well region 30 may be configured to set the threshold voltage.

The gate structure 34 is formed on or above the semiconductor substrate 22 over the well region 30. The gate structure 34 includes an oxide or other dielectric layer (not numbered) disposed on the surface 32. For example, the dielectric layer may include silicon dioxide (or oxide) deposited or otherwise formed on the surface 32. The gate structure 34 may include any number of dielectric layers. The dielectric layer spaces a polysilicon or other conductive layer 36 of the gate structure 34 from the well region 30. One or more metal interconnect layers 38 may, in turn, be disposed on the polysilicon layer 36. The materials, shape, construction, and other characteristics of the gate structure 34 may vary. For example, the lateral extent to which the well region 30 extends under the gate structure 34 may vary from the example shown. The gate structure 34 may include additional components. For example, the gate structure 34 may include one or more dielectric sidewall spacers disposed along lateral edges of the gate structure 32. The sidewall spacers may cover the lateral edges to act as a silicide block to prevent a silicide short along the surface 32. The sidewall spacers may provide spacing to separate the conductive components of the gate structure 34 from other structures or components of the device 20. One or more of the sidewall spacers may alternatively or additionally be used for alignment purposes in defining an edge of one or more regions of the device 20. The edges of one or more other regions may be aligned with the gate structure 34 as described below.

The configuration of the gate structure 34 may vary. For example, the gate structure 34 may include multiple conductive layers (e.g., polysilicon plates). The components, materials, and other characteristics of the gate structures 34 may vary from the example shown. For example, the device 20 may include multiple gate structures.

The device 20 includes a heavily doped source region 40 and drain region 42 in the semiconductor substrate 22. The source region 40 and the drain region 42 are laterally spaced from one another at the surface 32 of the semiconductor substrate 22. The gate structure 34 is supported by the semiconductor substrate 22 between the source region 40 and the drain region 42. The source region 40 may be disposed along or aligned with a sidewall 44 of the gate structure 34. In some embodiments, the source region 40 and the drain region 42 may have additional or alternative lateral spacing. Any number of source regions 40 and drain regions 42 may be provided. For example, the drain region 42 may be centered or otherwise disposed between, or laterally surrounded by, two portions of the source region 40 or two separate source regions. For example, the device 20 may be configured as a single transistor with a dual gate finger configuration. In this example, the source region 40 and the drain region 42 are n-type doped portions of the second epitaxial layer 25. The heavily doped n-type source region 40 is adjacent the well region 30. The heavily doped n-type drain region 42 is spaced from the source 40 and the well 30. Such spacing defines a conduction path of the device between the source region 40 and the drain region 42. The source region 40 and the drain region 42, or a portion thereof, may have a dopant concentration at a level sufficient to establish ohmic contacts with electrodes or interconnects 45 and 46, for biasing or applying voltages to the source region 40 and the drain region 42, respectively. During operation, the drain region 42 may be biased or otherwise disposed at a relatively high drain-source voltage (Vds) relative to the source region 40. A sinker region 62 may be configured to extend from an Ohmic contact 64 with the source electrode 45, through the second epitaxial layer 25 and the first epitaxial layer 24 to reach the original semiconductor substrate 26. The sinker region 62 may be configured as a relatively heavily doped, p-type region to establish an electrical connection between the source electrode 45 (and, thus, the source region 40) and a backside or back surface 64 of the semiconductor substrate 22 on which a backside contact 66 (e.g., formed of metal or other conductive material) is deposited or otherwise disposed. The backside contact 66 may form an Ohmic contact with the original substrate 26 to complete the electrical connection between the source region 40 and the backside contact 66.

When the gate structure 34 is biased, charge carriers (in some embodiments, electrons; in other embodiments, holes) accumulate in a region at or near the surface 32 under or below the gate structure 34, thereby forming a channel that electrically extends from the source region 40 toward the drain region 42. The channel region is located in the well region 30 and other p-type portions of the semiconductor substrate 22 under the gate structure 34. The accumulation of charge carriers (e.g., electrons) results in a majority charge carrier inversion in the channel region from the p-type well region 30 (or second epitaxial layer 25) to an n-type conduction layer or area near the surface 32 of the semiconductor substrate 22. Once a sufficient amount of the charge carriers (e.g., electrons) accumulate in the channel region, charge carriers (e.g., electrons) are capable of flowing along a conduction path from the source region 40 to the drain region 42.

The channel is not limited to areas within the well region 30 or body region of the device 20. For instance, charge carriers may accumulate in an area 48 near the surface 32 in a region of the second epitaxial layer 25 adjacent the well region 30. A portion of the second epitaxial layer 25 may be disposed between the well region 30 and an n-type well or composite drift region described below (e.g., when the well region 30 does not touch or abut the n-type well or composite drift region as shown).

The conduction path or regions of the device 20 may include still other regions, whether n-type or p-type, at or near the surface 32. For instance, the channel and/or other conduction region of the device 20 may include one or more lightly or intermediately doped n-type transition regions in the semiconductor substrate 22. For example, the drain region 42 may include or be disposed adjacent to a lightly doped extension region.

The conduction path may include other regions or areas in the semiconductor substrate 22 in which charge accumulation occurs as a result of the bias applied to the gate structure 34. The conduction path of the device 20 is not limited to regions in which majority charge carrier inversion occurs or to regions in which conduction is enabled or enhanced via the bias voltage applied to the gate structure 34. In this example, charge carriers also gather along the surface 32 in an accumulation region outside of or beyond the well region 30. The gate structure 34 may extend over the accumulation region to a varying extent.

The device 20 includes a composite drift region 50 in the semiconductor substrate 22 between the well region 30 and the drain region 42 in accordance with the present teachings.

The composite drift region 50 includes a first lateral section 68 adjacent to (e.g., under and/or next to) the drain region 42 and a second lateral section 70 adjacent to (e.g., next to, and either touching or not touching) the well section 30. A lower boundary 72 of the first lateral section 68 is deeper in the semiconductor substrate 22 than a lower boundary 74 of the second lateral section 70. The composite drift region 50 combines a buried NHV region (e.g., formed via the growth and implantation of multiple epitaxial layers) with a shallower NHV region. The buried NHV region, which may be located primarily under the drain region 42, may be merged with a shallow NHV region, which may be proximal to the well region 30, during one or more subsequent anneal cycles. Thus, in the example shown in FIG. 1, the first lateral section 68 corresponds primarily to the buried NHV region, and the second lateral section 70 corresponds primarily to the shallow NHV region. Although the first lateral section 68 corresponds primarily to the buried NHV region, the first lateral section 68 may further include at least a portion of the shallower NHV region adjacent thereto. In some embodiments, the doping level of the shallower NHV region is higher than the doping level of the buried NHV region, as further described below.

In the example shown in FIG. 1, the composite drift region 50 is established via the formation of an n-type well. The n-type well may be configured for high voltage device operation, and may thus be referred to as an n-type high-voltage (NHV) well. For example, the portion of the composite drift region 50 underlying the drain 42 may have a dopant concentration lower than the dopant concentration of the source region 40 and the drain region 42 to support such high voltage device operation. The composite drift region 50 may support the creation of the accumulation region under the gate structure 34. In this example, the composite drift region 50 extends up to or under a drain-side portion or sidewall of the gate structure 34. The composite drift region 50 laterally extends from the drain-side sidewall of the gate structure 34 to the drain region 42, which may be formed in or otherwise on the composite drift region 50. The lateral extension of the composite drift region 50 allows charge carriers (e.g., electrons) in the channel region to reach the drain region 42 during operation. The lateral extent of the composite drift region 50 may vary. For example, the size of the area 48 between the well region 30 and the composite drift region 50 may vary. The depth, size, and other characteristics of the composite drift region 50 may vary.

The device 20 may include a Faraday or other shield 52 disposed along or over a portion of the composite drift region 50 and a drain-side edge or sidewall of the gate structure 34. The shield 52 may include one or more field plates that extend over a portion of the gate structure 34 and/or the composite drift region 50. The device 20 may include one or more passivation layers 54 covering the surface 32. In some embodiments, the shield 52 is disposed between two of the passivation layers 54. The shield 52 may help protect the dielectric layer of the gate structure 34 from damage or degradation arising from charge carriers accelerated under the electric field arising from the drain-source voltage. The shield 52 may also help to reduce the maximum electric field in the composite drift region 50. The shield 52 may be grounded or otherwise biased to deter injection of such hot carriers into the oxide or other dielectric material under the gate structure 34 and/or the oxide or other dielectric material over the composite drift region 50.

The device 20 is shown in simplified form in FIG. 1. For example, FIG. 1 does not show a number of metal layers configured for electric connections with the source region 40, the drain region 42, and the gate structure 34. The device 20 may have a number of other structures or components for connectivity, isolation, passivation, and other purposes not shown in FIG. 1 for ease in illustration. For instance, the device 20 may include any number of isolating regions or layers. Any number of shallow trench isolation (STI) regions, deep trench isolation (DTI) or field oxide regions (fieldox) may be formed at the surface 32 of the semiconductor substrate 22. Other STI regions may be disposed in the semiconductor substrate 22 to isolate or separate various contact regions. One or more further STI regions, other isolation trenches, and/or isolation wells (not shown) may be provided to isolate the device area 28 and/or active area of the device 20. In some examples, another p-type epitaxial layer may be disposed between the original substrate 26 and the surface 32 of the semiconductor substrate 22 in the device area 28 (e.g., above the second epitaxial layer 25).

The device 20 may be configured with one or more lightly or intermediately doped transition regions (e.g., n-type lightly doped drain, or NLDD, regions) at or near the source region 40 and the drain region 42. Each transition region may be or include a diffused region formed in connection with the source region 40 and/or the drain region 42 and may thus be referred to herein as a source/drain extension region. Such transition regions may assist in controlling the electric field at or near the surface 32, including in areas other than those areas near the source region 40 or the drain region 42.

The dopant concentrations, thicknesses, and other characteristics of the above-described semiconductor regions in the semiconductor substrate 22 may vary. For example, the dopant concentration of the original substrate 26 may vary considerably. The dopant concentrations and/or depths may have values larger or smaller than the values or ranges provided herein.

Figure 2:
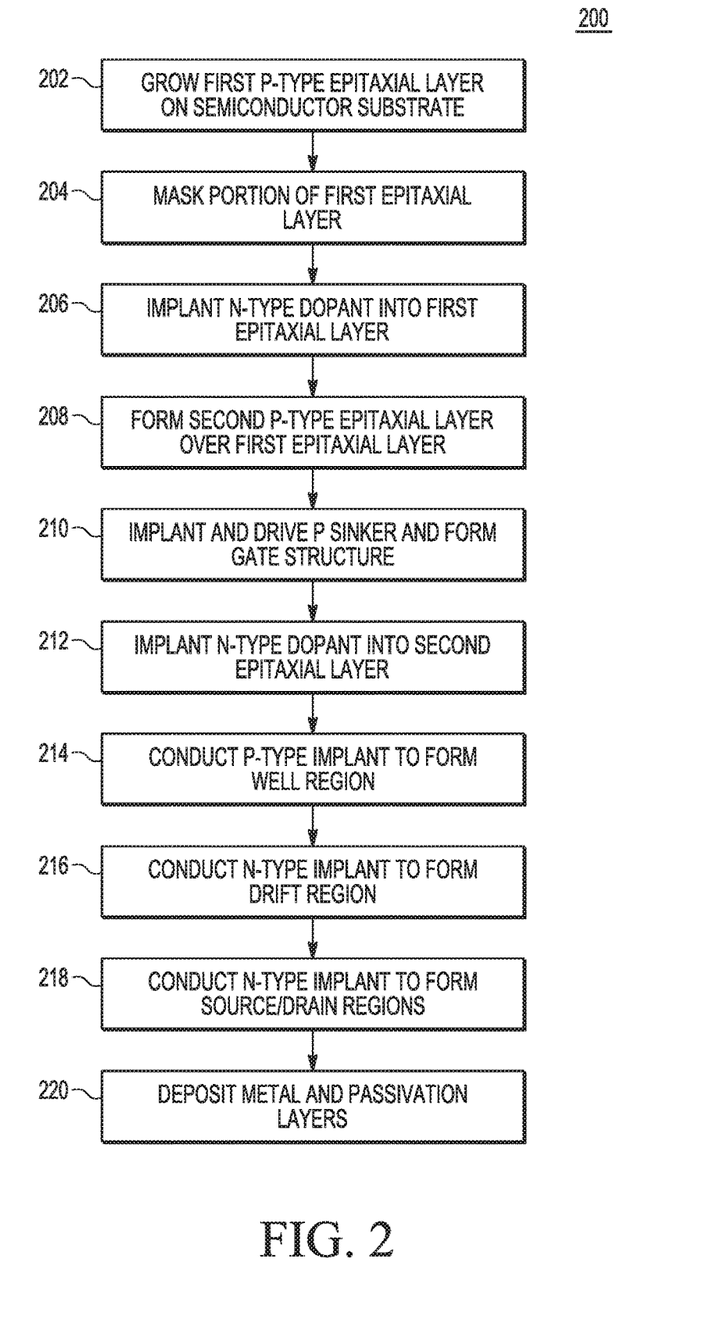
FIG. 2 shows a flow diagram illustrating exemplary acts in a method of fabricating a semiconductor device in accordance with the present teachings.

FIG. 2 shows an exemplary method 200 for fabricating a device with a buried NHV region configured as described above. The transistor device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. It is to be understood that the relative ordering of some acts shown in the flow chart of FIG. 2 is meant to be merely representative rather than limiting, and that alternative sequences may be followed. Moreover, it is likewise to be understood that additional, different, or fewer acts may be provided, and that two or more of these acts may occur sequentially, substantially contemporaneously, and/or in alternative orders. The fabrication method is not limited to any particular doping mechanism, and may include future developed doping techniques.

The method 200 may begin with, or include, an act 202 in which a p-type epitaxial layer (e.g., layer 24, FIG. 1) is grown on a p-type original semiconductor substrate (e.g., substrate 26, FIG. 1). In some embodiments, at least a portion of the first epitaxial layer is masked in act 204, and n-type dopant is implanted into the first epitaxial layer in act 206, thereby forming a portion of what is to be a composite drift region (e.g., a lower portion of section 68 of region 50, FIG. 1). An annealing step may be performed after the implantation of act 206 and prior to formation of the second epitaxial layer in act 208. In act 208, a second p-type epitaxial layer (e.g., layer 25, FIG. 1) is formed over the first epitaxial layer.

In some embodiments, in act 210, a sinker region may be formed (e.g., via ion implantation), and one or more buried isolating layers may be formed in or below the first and/or second epitaxial layers. The sinker region may be formed during the growth of an epitaxial layer. Alternatively, the sinker region may be formed via an implant configured to extend through one or both epitaxial layers to reach the original semiconductor substrate. Any number of epitaxial layers may be grown. In act 212, the second epitaxial layer is implanted with dopant (e.g., with a p-type dopant). Thus, as shown in FIG. 2, a sinker region is formed and an anneal is performed prior to the shallow NHV implantation further described below.

After all of the epitaxial growth is complete, a gate structure (e.g., gate structure 34, FIG. 1) of the transistor device may be formed on a surface of the semiconductor substrate. The formation of the gate structure may include the deposition or growth of a gate oxide layer and one or more conductive gate layers (e.g., a polysilicon layer and a silicide layer on the polysilicon layer), as well as patterning (e.g., etching) of such layers.

A photoresist layer, for example, may then be used as a mask in a dopant implant procedure conducted in an act 214. The implant is configured to form a base or well region (e.g., well region 30, FIG. 1) in the semiconductor substrate. The act 214 includes a drive procedure to allow the well region to extend a desired lateral distance under the gate structure via lateral diffusion. The drive procedure may be configured to establish the characteristics of a channel region formed during operation.

In an act 216, the substrate is doped to form an additional portion of the composite drift region and/or drain extension of the device (e.g., section 70 and an upper portion of section 68 of region 50, FIG. 1). The doping procedure may include an n-type dopant implantation configured to define an n-type well. A drain-side of the gate structure may be used to align the composite drift region with the gate structure. The act 216 may include a drive procedure to achieve a desired depth and dopant concentration profile for the composite drift region. Implant and drive procedures in accordance with the present teachings may be configured to merge a first n-type region (e.g., the buried NHV region or at least a portion thereof) that is formed, at least in part, by act 206 with a second n-type region (e.g., the shallow NHV region or at least a portion thereof) that is formed, at least in part, by act 212. Moreover, implant and drive procedures in accordance with the present teachings may be configured such that a first lateral section of the composite drift region (e.g., section 68, FIG. 1) adjacent to the drain region has a bottom boundary that is deeper than a bottom boundary of a second lateral section adjacent to the well region (e.g., section 70, FIG. 1). The gate structure (including any spacer) may again be used as a mask for the implant procedure in addition to or as an alternative to one or more other masking layers. In some embodiments, the implantation of dopant is conducted at an angle with respect to vertical to space or shape one or more features of the composite drift region.

Another n-type implant is conducted in an act 218 to form source and drain regions (e.g., regions 40, 42, FIG. 1). The gate structure and/or another photoresist layer may be used as a mask to align the source region with the source-side edge of the gate structure. The act 218 may include a photoresist masking process and a drive procedure to achieve a desired depth and dopant concentration profile for the source and drain regions. One or more n-type ion implantation procedures may be performed. For example, formation of one or both of the source region and the drain region may include a moderate implant before formation of sidewall spacers of the gate structure to create one or more transition regions (see, for example, FIG. 1). A heavy implant after formation of the sidewall spacers may then be implemented to form the source and/or drain regions adjacent to such transition regions.

In an act 220, a number of metal and passivation layers may be deposited. The metal layers may include one or more layers to form gate, source and drain electrodes (e.g., electrodes 38, 45, 46, FIG. 1), as well as one or more layers to form a backside contact (e.g., contact 66, FIG. 1). A number of passivation layers (e.g., layer 54, FIG. 1) may be deposited to isolate and/or define the metal layers, including, for example, a Faraday or other shield (e.g., shield 52, FIG. 1) along the gate structure.

Additional acts may be implemented at various points during the fabrication procedure. For example, one or more acts may be directed to annealing (e.g., in some embodiments, after forming the second epitaxial layer in act 208). In addition, one or more acts may be directed to defining an active area of the device. In some embodiments, such acts may include the formation of one or more device isolating wells, layers, or other regions. One or more metal layers may be deposited. Any number of additional STI and/or DTI regions may be formed. The procedures may be implemented in various orders. Additional or alternative procedures may be implemented.

In a first aspect, a semiconductor device in accordance with the present teachings includes (a) a semiconductor substrate including a source region and a drain region, the semiconductor substrate having a first conductivity type; (b) a gate structure supported by the semiconductor substrate between the source region and the drain region; (c) a well region in the semiconductor substrate, wherein the well region has a second conductivity type and wherein the well region is configured to form a channel therein under the gate structure during operation of the semiconductor device; and (d) a composite drift region in the semiconductor substrate. The composite drift region extends laterally from the drain region to at least an edge of the gate structure. In addition, the composite drift region includes dopant having the first conductivity type. At least a portion of the dopant is buried beneath the drain region at a depth exceeding an ion implantation range.

In a second aspect, an electronic apparatus in accordance with the present teachings includes a substrate and a field-effect transistor device disposed in the substrate. The field-effect transistor device includes: (a) first and second semiconductor regions having a first conductivity type; (b) a third semiconductor region having a second conductivity type and configured to form a channel therein between the first semiconductor region and the second semiconductor region during operation of the field-effect transistor device; and (c) a fourth semiconductor region extending laterally from the first semiconductor region towards the third semiconductor region. The fourth semiconductor region includes dopant having the first conductivity type. At least a portion of the dopant is buried beneath the first semiconductor region at a depth exceeding an ion implantation range.

In a third aspect, a method of fabricating a transistor in accordance with the present teachings includes (a) forming a source region and a drain region in a semiconductor substrate having a first conductivity type; (b) forming a well region in the semiconductor substrate via lateral diffusion, the well region configured to form a channel during operation of the semiconductor device; (c) forming a gate structure between the source region and the drain region; and (d) forming a composite drift region in the semiconductor substrate. The composite drift region extends laterally from the drain region to at least an edge of the gate structure. In addition, the composite drift region includes dopant having the first conductivity type. At least a portion of the dopant is buried beneath the drain region at a depth exceeding an ion implantation range.

Semiconductor devices with a conductive gate electrode positioned over a dielectric or other insulator may be considered MOS devices despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The composite drift region and buried NHV thereof in accordance with the present teachings may be used to increase the current capability of LDMOS devices (e.g., RF LDMOS devices). For example, in various embodiments, an LDMOS device with a BV greater than 200 V (and, in some embodiments, up to about 300 V), with reduced Cdg and low Ron is provided. In some embodiments, a thickness of the first epitaxial layer 24 shown in FIG. 1 is between about 8 and about 15 microns (e.g., about 9 microns), and a thickness of the second epitaxial layer 25 is between about 2 and about 4 microns (e.g., about 3.2 microns). In some embodiments, a length of the composite drift region 50 shown in FIG. 1, measured from a drain-side edge of the gate structure 34 to an edge of the drain contact 46 is between about 10 and about 22 microns (e.g., about 21 microns).

Figure 3:
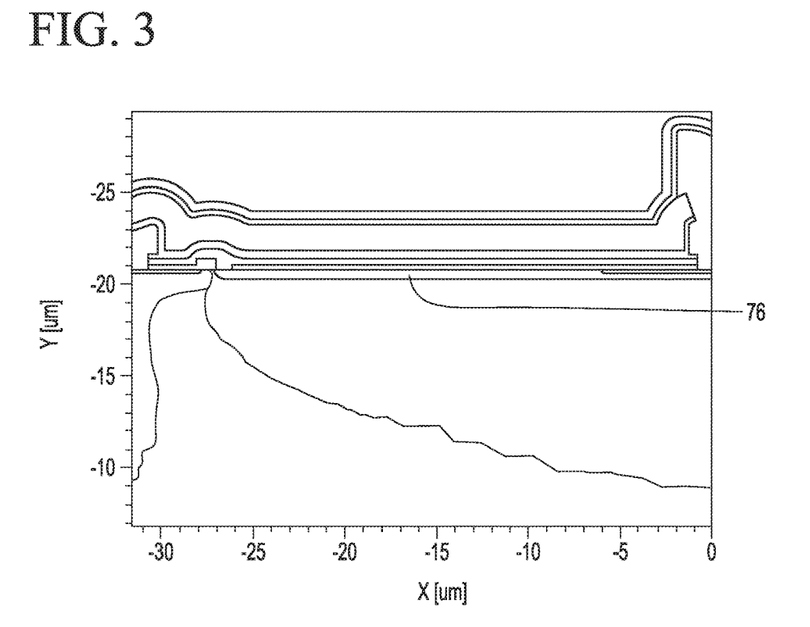
FIG. 3 shows a technology computer-aided design (TCAD) schematic illustration of a drift region corresponding to a standard As-implanted NHV region.
Figure 4:
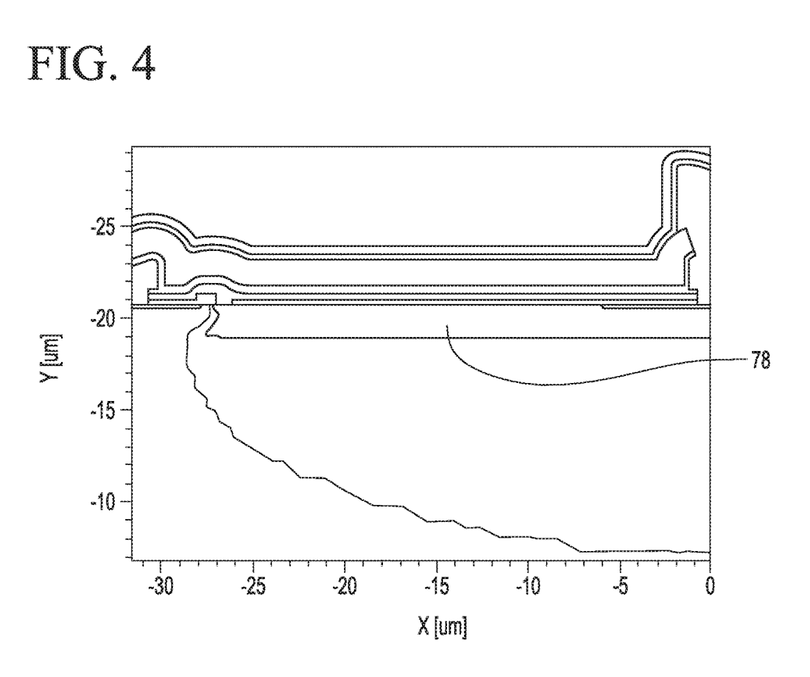
FIG. 4 shows a cross-sectional schematic view of a drift region corresponding to an As and P double implant NHV region.
Figure 5:
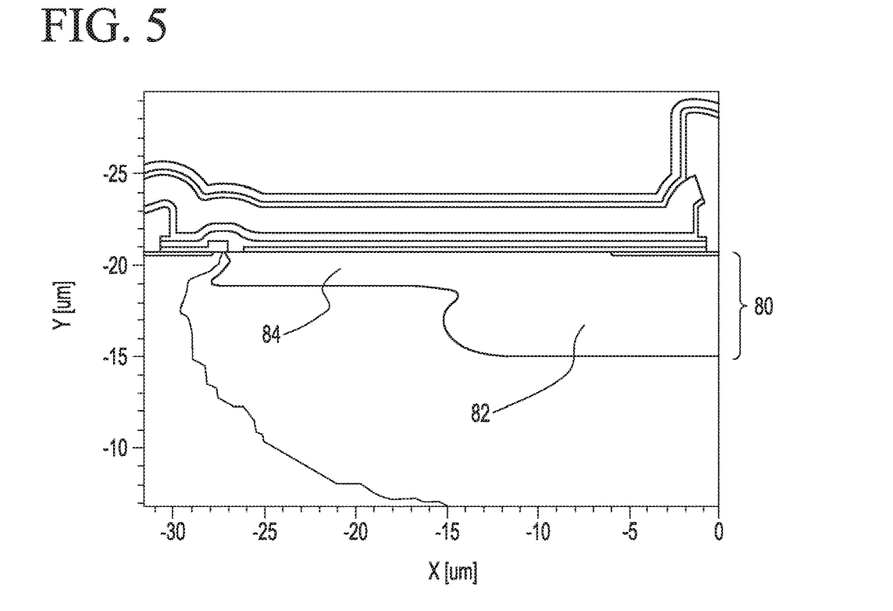
FIG. 5 shows a cross-sectional schematic view of a composite drift region corresponding to an As and P double implant NHV region having a buried NHV region in accordance with the present teachings.

FIGS. 3, 4, and 5, respectively, show (a) a drift region 76 corresponding to a standard As-implanted NHV region, (b) a drift region 78 corresponding to an As and P double implant NHV region, and (c) a composite drift region 80 corresponding to an As and P double implant NHV region having a buried NHV region 82 in accordance with the present teachings. The drift region 76 in FIG. 3 is shallow. By comparison, the drift region 78 in FIG. 4 has a somewhat deeper NHV extension, which may help to increase BV. However, as shown in FIG. 5, the drift region 80 provided by a two-step epitaxial growth procedure in accordance with the present teachings results in a much deeper NHV well 82 that substantially increases the vertical BV. In the composite drift region 80 shown in FIG. 5, the doping level of the shallow NHV region 84 is higher than the doping level of the buried NHV region 82. By way of example, in some embodiments, the doping level of the shallow NHV 84 is about $4 \cdot 10^{16}$ Cm$^{-3}$ and the doping level of the buried NHV 82 is about $10^{15}$ Cm$^{-3}$. The location of the masking area with respect to the gate may be calculated to optimize the resurf effect (e.g., equidistant from the gate and the drain contact).

Figure 6:
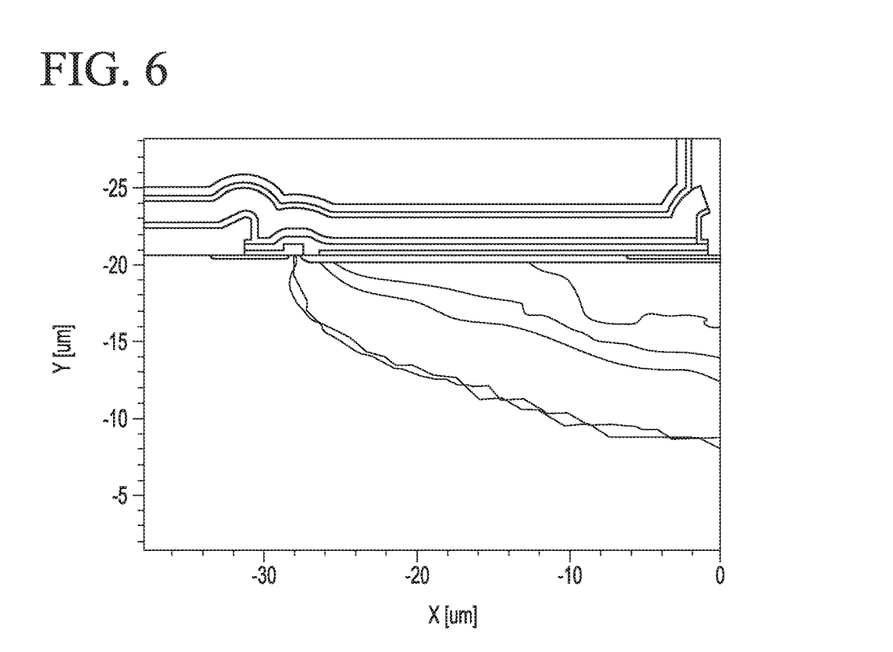
FIG. 6 shows a cross-sectional schematic view of an impact ionization distribution at a breakdown voltage of 120V.
Figure 7:
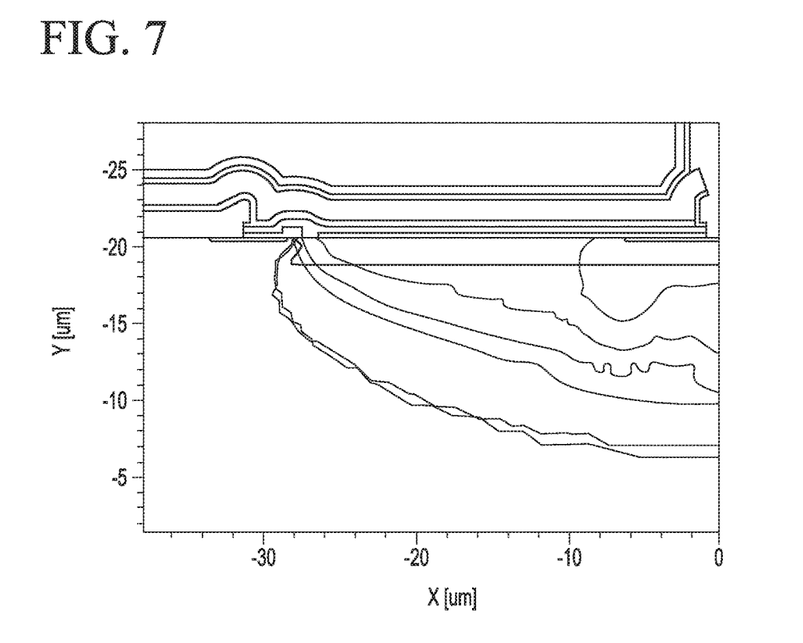
FIG. 7 shows a cross-sectional schematic view of an impact ionization distribution at a breakdown voltage of 200V.
Figure 8:
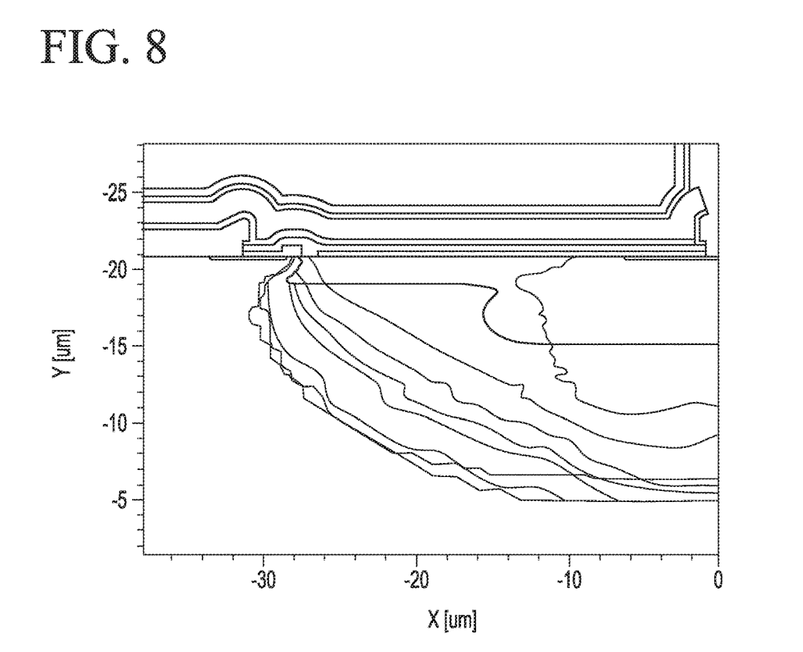
FIG. 8 shows a cross-sectional schematic view of an impact ionization distribution at a breakdown voltage of 300V using an exemplary semiconductor device in accordance with the present teachings.

FIGS. 6, 7, and 8 show impact ionization distributions at breakdown in connection with each of the drift regions shown in FIGS. 3, 4, and 5, respectively. As shown in FIG. 6, BV is purely vertical and impact during breakdown is localized near the drain contact. The BV in FIG. 6 is 120V. In FIG. 7, since the NHV in the drift region is deeper, the impact is not as concentrated as in FIG. 6 although it remains vertical. The BV in FIG. 7 is 200 V. In FIG. 8, the device includes buried NHV and, as a result, the impact ionization distribution is much more homogeneous and spread out than in FIGS. 6 and 7. The BV in FIG. 8 is 300V. For the device of FIG. 8, BV increases, Ron decreases, and the device robustness is improved relative to a device that lacks a buried NHV region.

Figure 9:
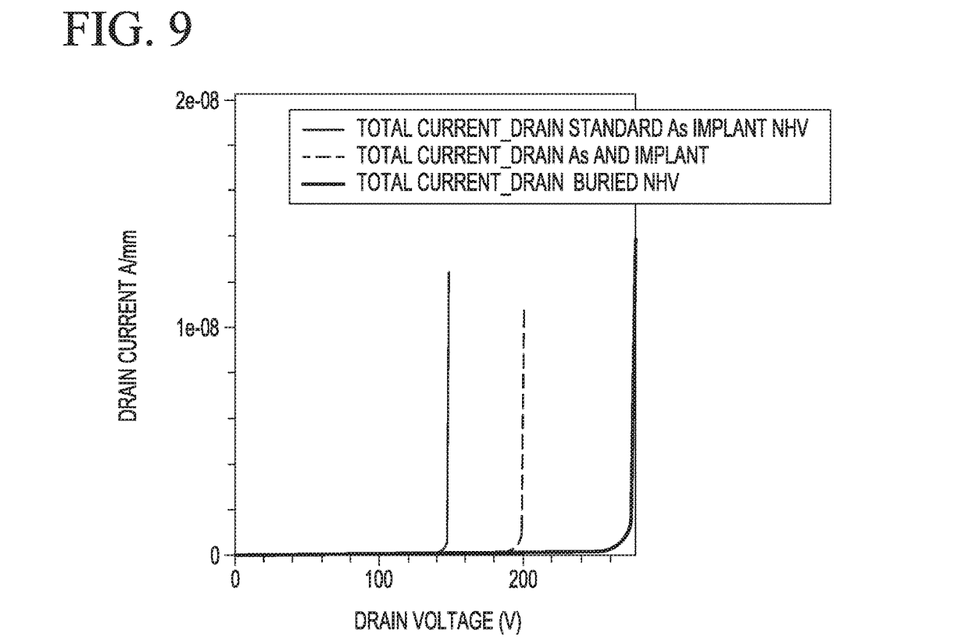
FIG. 9 shows a plot of drain current vs. drain voltage illustrating breakdown voltages for (a) a device that includes a standard shallow As-implanted NHV region, (b) a device that includes an As and P double implant NHV region, and (c) a device that includes an As and P double implant region in combination with a buried NHV in accordance with the present teachings.

FIG. 9 shows a plot of drain current vs. drain voltage illustrating breakdown voltages for (a) a device that includes a standard shallow As-implanted NHV region, (b) a device that includes an As and P double implant NHV region, and (c) a device that includes an As and P double implant region in combination with a buried NHV in accordance with the present teachings. As shown in FIG. 9, a device in accordance with the present teachings has a substantially higher breakdown voltage.

Figure 10:
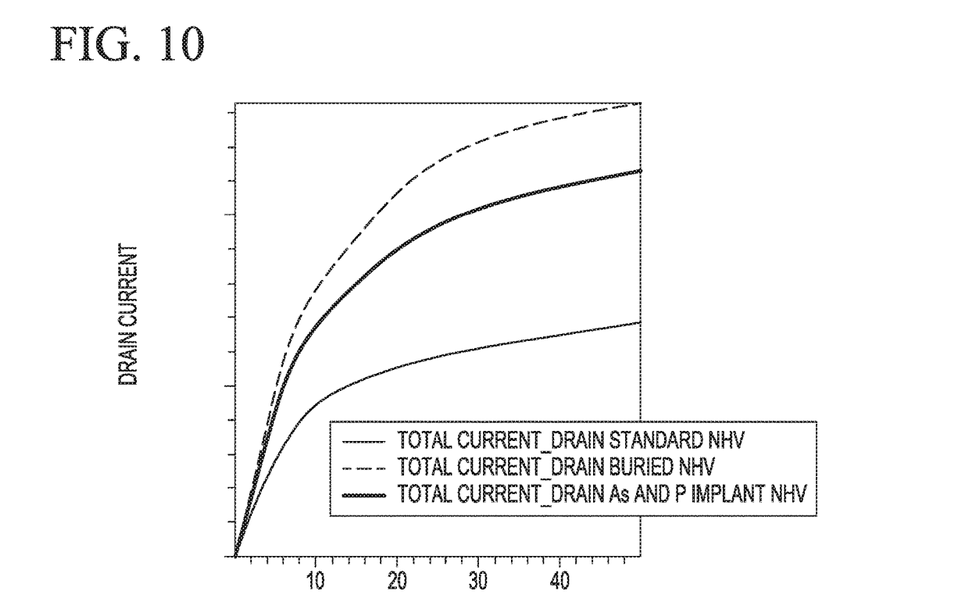
FIG. 10 shows a plot of drain current vs. drain voltage illustrating Idmax for (a) a device that includes a standard shallow As-implanted NHV region, (b) a device that includes an As and P double implant NHV region, and (c) a device that includes an As and P double implant region in combination with a buried NHV in accordance with the present teachings.

FIG. 10 shows a plot of drain current vs. drain voltage illustrating Idmax for (a) a device that includes a standard shallow As-implanted NHV region, (b) a device that includes an As and P double implant NHV region, and (c) a device that includes an As and P double implant region in combination with a buried NHV in accordance with the present teachings. FIG. 10 shows that for a given NHV extension (e.g., 21 μm), the addition of a deeper NHV region promotes a higher drain current.

Figure 11:
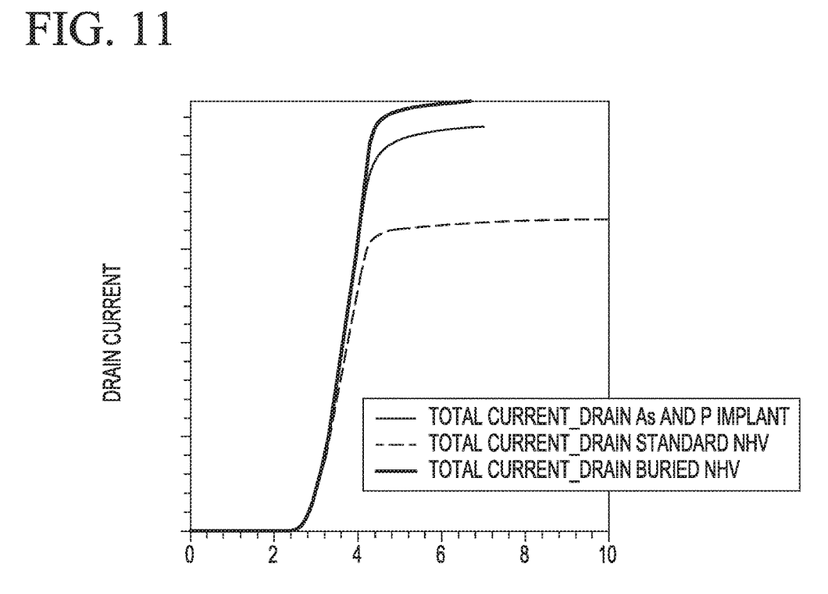
FIG. 11 shows a plot of drain current vs. gate voltage for (a) a device that includes a standard shallow As-implanted NHV region, (b) a device that includes an As and P double implant NHV region, and (c) a device that includes an As and P double implant region in combination with a buried NHV in accordance with the present teachings.

FIG. 11 shows a plot of drain current vs. gate voltage for (a) a device that includes a standard shallow As-implanted NHV region, (b) a device that includes an As and P double implant NHV region, and (c) a device that includes an As and P double implant region in combination with a buried NHV in accordance with the present teachings. As shown in FIG. 11, there is no impact on threshold voltage although there is an increase in saturation current.

Figure 12:
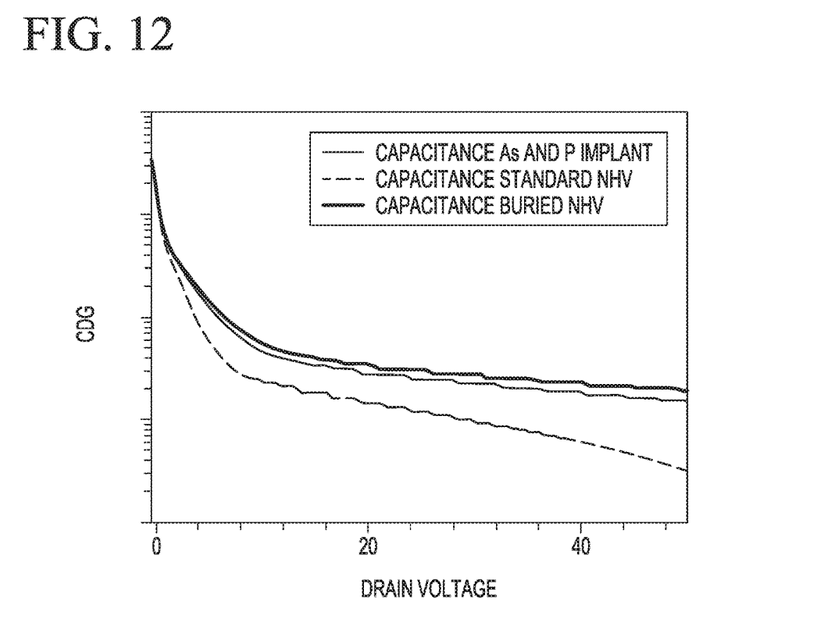
FIG. 12 shows a plot of drain-gate capacitance vs. drain voltage for (a) a device that includes a standard shallow As-implanted NHV region, (b) a device that includes an As and P double implant NHV region, and (c) a device that includes an As and P double implant region in combination with a buried NHV in accordance with the present teachings.

FIG. 12 shows a plot of drain-gate capacitance vs. drain voltage for (a) a device that includes a standard shallow As-implanted NHV region, (b) a device that includes an As and P double implant NHV region, and (c) a device that includes an As and P double implant region in combination with a buried NHV in accordance with the present teachings. Although there is an increase on capacitance with drain bias, the 0V Cdg is unchanged with the presence of the NHV buried layer. This feature may be beneficial in RF applications where linearity affects device performance.

The foregoing examples and representative procedures illustrate features in accordance with the present teachings, and are provided solely by way of illustration. They are not intended to limit the scope of the appended claims or their equivalents. Moreover, it is to be understood that elements and features of the various representative embodiments described above may be combined in different ways to produce new embodiments that likewise fall within the scope of the present teachings.

The foregoing detailed description and the accompanying drawings have been provided by way of explanation and illustration, and are not intended to limit the scope of the appended claims. Many variations in the presently preferred embodiments illustrated herein will be apparent to one of ordinary skill in the art, and remain within the scope of the appended claims and their equivalents.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding claim—whether independent or dependent—and that such new combinations are to be understood as forming a part of the present specification.

What is claimed is:

1. A method of fabricating a semiconductor device, the method comprising:

implanting a first dopant having a first conductivity type in a portion of a partially-formed semiconductor substrate to form a portion of a composite drift region;

forming an upper epitaxial layer over the partially-formed semiconductor substrate, wherein a semiconductor substrate includes the partially-formed semiconductor substrate and the upper epitaxial layer;

forming a gate structure over the upper epitaxial layer, forming an additional portion of the composite drift region by implanting a second dopant having the first conductivity type in the upper epitaxial layer, wherein the composite drift region is aligned with a side of the gate structure upon forming the additional portion of the composite drift region;

forming a source region and a drain region in the semiconductor substrate, wherein the drain region is substantially aligned with the portion of the semiconductor substrate in which the first dopant is implanted, and wherein the composite drift region extends laterally from the drain region to at least the side of the gate structure; and forming a well region in the semiconductor substrate, the well region configured to form a channel during operation of the semiconductor device.

2. The method of claim 1, further comprising:

forming a first epitaxial layer on an original substrate to produce the partially-formed semiconductor substrate; and wherein forming the composite drift region comprises:
  masking at least a portion of the first epitaxial layer; and
  implanting the first dopant in at least an unmasked portion of the first epitaxial layer, at least a portion of the unmasked portion being substantially aligned with the drain region.

3. The method of claim 1, wherein the first dopant implanted in the portion of the partially-formed semiconductor substrate and the second dopant implanted in the upper epitaxial layer are each independently selected from the group consisting of arsenic (As), phosphorus (P), and a combination thereof.

4. The method of claim 1, wherein forming the source region and the drain region comprises implanting dopant into the upper epitaxial layer.

5. The method of claim 1, wherein forming the well region comprises implanting dopant into the upper epitaxial layer.

6. The method of claim 1, further comprising forming a sinker region electrically connected to the source region, the sinker region extending through the upper epitaxial layer.

7. The method of claim 1, wherein forming the composite drift region further comprises conducting a dopant drive procedure after implanting the second dopant in the upper epitaxial layer to merge a region formed by implanting the first dopant with a region formed by implanting the second dopant in the upper epitaxial layer.

8. The method of claim 7, wherein the dopant drive procedure is configured such that a first lateral section of the composite drift region adjacent to the drain region has a bottom boundary deeper than a bottom boundary of a second section of the composite drift region adjacent to the well region.

9. A method of fabricating a semiconductor device, the method comprising:

forming a first epitaxial layer on a semiconductor substrate;

forming a first portion of a composite drift region in the first epitaxial layer;

after forming the first portion of the composite drift region, forming a second epitaxial layer over the first epitaxial layer;

forming a gate structure over the second epitaxial layer;

forming a source region and a drain region in the second epitaxial layer;

after forming the gate structure, forming a second portion of the composite drift region in the second epitaxial layer using a side of the gate structure to align the composite drift region with the gate structure, wherein the composite drift region extends laterally from the drain region to at least the side of the gate structure; and forming a well region in the second epitaxial layer, the well region configured to form a channel during operation of the semiconductor device.

10. The method of claim 9, wherein forming the second portion of the composite drift region comprises:
  conducting a dopant implantation procedure; and
  conducting a dopant drive procedure after the dopant implantation procedure to merge the first and second portions of the composite drift region.

11. The method of claim 10, wherein the dopant drive procedure is configured such that a first lateral section of the composite drift region adjacent to the drain region has a bottom boundary deeper than a bottom boundary of a second section of the composite drift region adjacent to the well region.

12. The method of claim 9, further comprising forming a sinker region electrically connected to the source region, the sinker region extending through the first and second epitaxial layers.

13. The method of claim 9, wherein the first portion of the composite drift region is under the drain region.

14. The method of claim 9, wherein the second portion has a higher dopant concentration level than the first portion.

15. The method of claim 9 wherein forming the first portion of the composite drift region comprises implanting a plurality of different types of n-type dopant.

16. The method of claim 15 wherein the n-type dopant is selected from the group consisting of arsenic (As), phosphorus (P), and a combination thereof.

* * * * *